United States Patent

Lurtz

[11] 4,054,803
[45] Oct. 18, 1977

[54] MATCHER CIRCUIT

[75] Inventor: John Walter Lurtz, Naperville, Ill.

[73] Assignee: Bell Telephone Laboratories, Incorporated, Murray Hill, N.J.

[21] Appl. No.: 717,596

[22] Filed: Aug. 26, 1976

[51] Int. Cl.² .......................................... H03K 19/20
[52] U.S. Cl. .................................. 307/218; 307/214; 307/216
[58] Field of Search ............... 307/215, 216, 218, 214

[56] References Cited
U.S. PATENT DOCUMENTS

| | | | |
|---|---|---|---|
| 3,252,011 | 5/1966 | Zuk | 307/216 X |
| 3,278,758 | 10/1966 | Vroman | 307/216 X |
| 3,916,217 | 10/1975 | Shimada et al. | 307/218 X |

*Primary Examiner*—John S. Heyman
*Attorney, Agent, or Firm*—John C. Albrecht

[57] ABSTRACT

A matcher circuit for comparing two binary signals which are presented to two separate units is disclosed. The matcher circuit comprises two half matchers, one in each unit. Each half matcher circuit detects one of the two possible mismatch conditions. The two half matcher circuits are connected by a single wire which is connected to the output of a gate in each half matcher such that the wire is a tied collector AND gate thereby allowing bidirectional information flow on the wire.

4 Claims, 2 Drawing Figures

MATCHER CIRCUIT

BACKGROUND OF THE INVENTION

The occurrence of errors and faults in the operation of digital electronic circuitry may be detected by the use of duplicated units running in parallel on identical input data along with circuitry which compares corresponding signals from the duplicate units. Such signal comparison circuits are often termed "matcher circuits" in digital processing technology. In order to utilize identical processing units and to provide independent error and fault output signals in each unit, matcher circuitry is provided in each of the duplicated processing units and the signals to be compared are cross-coupled between the duplicated units. The circuitry in a processing unit may comprise a full matcher circuit which generates inequality signals for all types of mismatch errors, i.e., $A$ = "0" and $B$ = "1", or $A$ = "1" and $B$ = "0", or, alternatively, the matcher circuitry in each unit comprises a half matcher circuit which generates a mismatch signal for only one of the two possible mismatch conditions. Where half matcher circuits are utilized, the half matcher in one unit detects one type of error, e.g., $A$ = "1", $B$ = "0"; while the half matcher in the other unit detects the other type of error, e.g., $A$ = "0", $B$ = "1". In any event, in such prior art circuitry whether full matcher or half matchers are utilized, the signals to be compared are cross-coupled between the duplicated units which requires two interconnecting wires for each pair of signals to be compared. It is an object of this invention to provide a pair of half matcher circuits interconnected by only a single wire thereby reducing the number of wires interconnecting the two duplicate units.

SUMMARY OF THE INVENTION

In accordance with the present invention a matcher circuit for determining the equality or inequality of a first signal and a second signal comprises a first and a second half matcher circuit each having an input terminal, an output terminal and a cross-coupling terminal. The two cross-coupling terminals are connected by a single wire. The first and second signals are connected to the corresponding input terminals of the first and second matcher circuits. An inequality signal is generated at each matcher circuit output terminal in response to predetermined signal conditions present on its associated input and cross-coupling terminals.

BRIEF DESCRIPTION OF THE DRAWING

A matcher circuit according to this invention will be better understood from a consideration of the detailed description of the organization and operation of one illustrative embodiment thereof which follows when taken in conjunction with the accompanying drawing in which.

DETAILED DESCRIPTION

Figure 1:
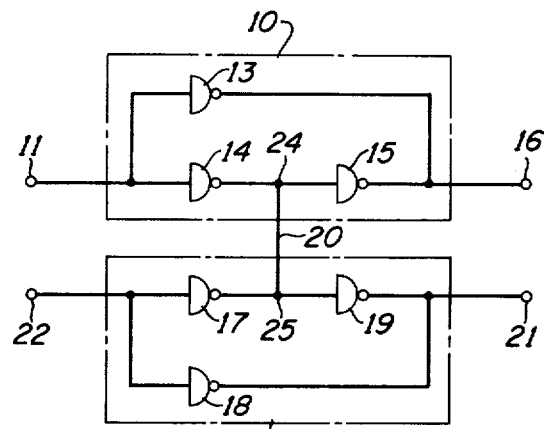
FIG. 1 depicts a matcher circuit for matching two signals.

One illustrative embodiment of a matcher circuit according to the invention is shown in FIG. 1 having inputs 11 and 22 for the application of two binary signals to be compared and outputs 16 and 21 for conducting signals indicating the equality or inequality of the signals applied to inputs 11 and 22. The matcher circuit comprises a half matcher circuit 10 and a half matcher circuit 12.

Half matcher circuit 10 comprises inverter gates 13 and 14 each having an input connected to input terminal 11. The output of inverter gate 14 is connected to a cross-coupling terminal 24 and to the input of an inverter gate 15 and the output of inverter gates 13 and 15 are both connected to output terminal 16.

Half matcher circuit 12 comprises inverter gates 17 and 18 each having an input connected to input terminal 22. The output of inverter gate 17 is connected to a cross-coupling terminal 25 and to the input of inverter gate 19 and the outputs of inverter gates 18 and 19 are both connected to output terminal 21. A single wire 20 is connected between the cross-coupling terminals 24 and 25.

A "wired AND" gate is created by the connection of the outputs of gates 13 and 15 in half matcher 10. A "wired AND" gate is also created by the connection of the outputs of gates 18 and 19 in half matcher 12. The connection of the outputs of gates 14 and 17 by the wire 20 creates a "wired AND" gate which connects the two half matcher circuits 10 and 12 and provides a signal at the inputs of gates 15 and 19. A "wired AND" gate is formed by the interaction of gates that have corresponding outputs wired together and functions as if an "AND" gate were present at the interconnection. "Wired AND" gates will be described in more detail in the following.

The wire 20 may be viewed as a bidirectional signal line which functions both as the inputs from gates 14 and 17 to the "wired AND" gate and the outputs thereof to gates 15 and 19. It is this bidirectional capability of wire 20 when connected to half matcher circuits 10 and 12 that allows a single wire to perform the function previously performed by two separate wires.

Figure 2:
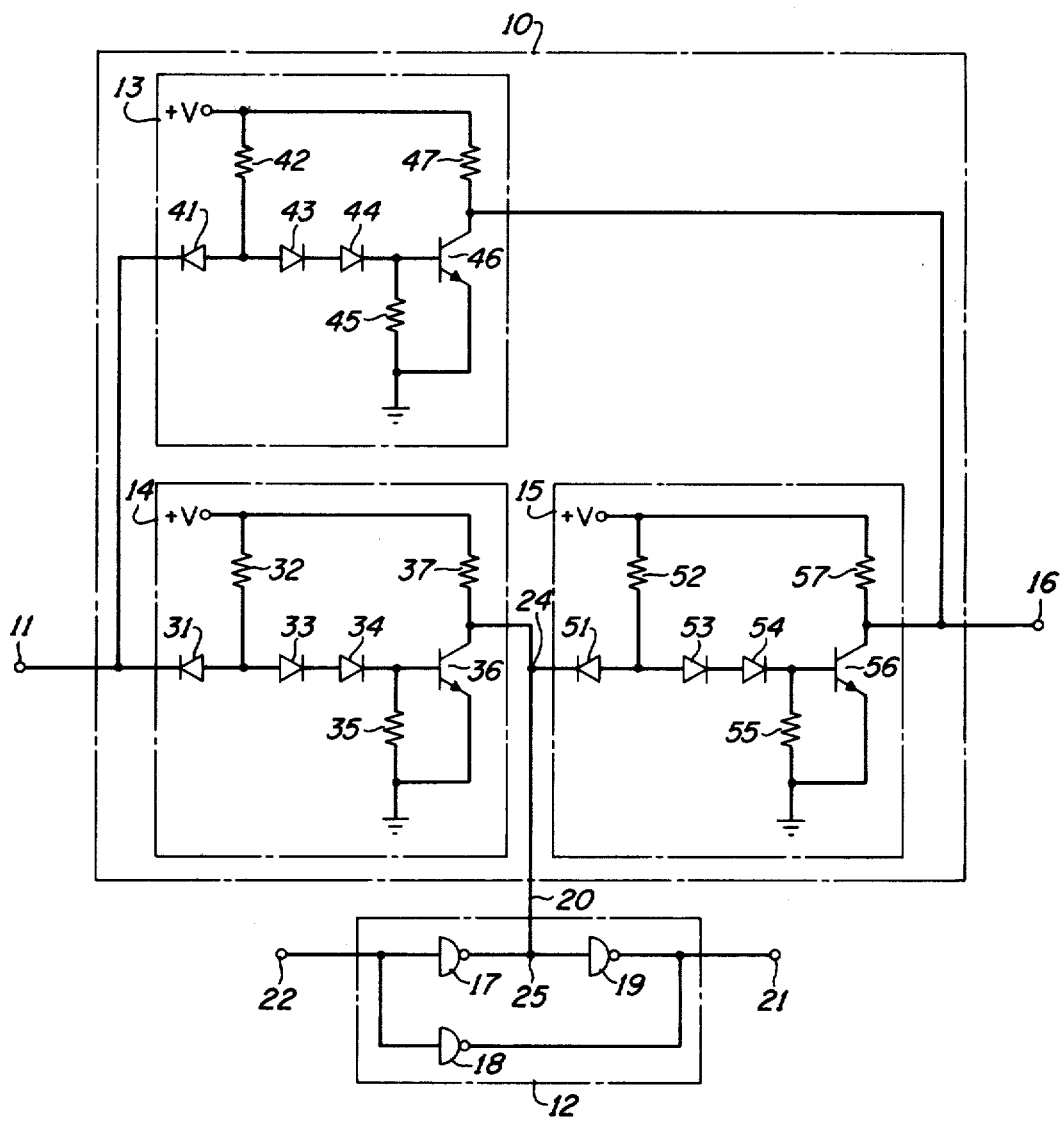
FIG. 2 depicts the matcher circuit of FIG. 1 with certain gates shown in a schematic circuit representation for one exemplary implementation.

One specific exemplary implementation of the matcher circuit of FIG. 1 is shown in FIG. 2 implemented using Diode Transistor Logic (DTL) inverter gates.

Inverter gate 14 comprises a diode 31 having its cathode connected to the input 11 of inverter gate 14 and its anode connected to one terminal of a resistor 32 and the anode of a diode 33. The second terminal of resistor 32 is connected to a positive voltage terminal. Diode 33 is connected in series with diode 34, both diodes being oriented in the same direction. The cathode of diode 34 is connected to a first terminal of a resistor 35 and the base terminal of a transistor 36. The second terminal of resistor 35 is connected to ground as is the emitter terminal of transistor 36. The collector of transistor 36 is connected to the positive voltage terminal through resistor 37. The output 24 of inverter gate 14 is connected to the common terminal of the collector of transistor 36 and one terminal of resistor 37.

Inverter gate 14 has two operative states corresponding to the two binary signals "0" and "1" applied to the input thereof. If a binary "0" signal, for example, a voltage less than 1.4 volts, is applied to the input of inverter gate 14, diode 31 will be forward biased thereby allowing current to flow from the positive voltage source through resistor 32 and diode 31 causing the voltage at the common node of diodes 31 and 33 and resistor 32 to be equal to the forward voltage drop across diode 31 or approximately 0.7 volts for a typical diode used in such a circuit. At the same time, current flows through resistor 32, diodes 33 and 34 and resistor 35 causing the voltage at the base of transistor 36 to be less than the voltage at the common node of diodes 31 and 33 and resistor 32 by approximately the forward voltage drop across diodes 33 and 34. The low voltage thereby present on the base of transistor 36 will result in the transistor 36 being cut off such that a high impedance is presented between the collector and emitter of transistor 36. The output terminal of inverter gate 14 will thereby present a voltage approximately equal to the positive voltage source since the impedance between the output terminal of inverter gate 14 and ground as presented by the transistor 36 is very high in comparison to resistor 37.

If a binary "1" signal, represented, for example, by a voltage approximately equal to the positive voltage source, is present on the input of inverter gate 14, the diode 31 will be reverse biased and will thereby become nonconductive. Currents will still flow through resistor 32, diodes 33 and 34, and base bias resistor 35 causing a relatively high positive voltage to be present on the base terminal of transistor 36 thereby causing transistor 36 to be driven into saturation and present a low impedance between the collector and emitter terminals thereof. The output terminal of inverter gate 14 will have present thereon a low voltage approximately equal to the collector-emitter voltage of transistor 36 under saturation, for example, 0.4 volts.

Inverter gates 13 and 15 are constructed according to the same circuit as inverter gate 14. Inverter gate 13 comprises corresponding elements: a diode 41, a resistor 42, diodes 43 and 44, a resistor 45, a transistor 46 and a resistor 47. Inverter gate 15 comprises corresponding elements: a diode 51, a resistor 52, diodes 53 and 54, a resistor 55, a transistor 56 and a resistor 57.

Binary logic gates such as shown in FIG. 2 may be constructed according to a number of different types of circuits commonly referred to as different logic families. It is well known in the art that for certain of these logic families, e.g., DTL, the outputs of two or more gates may be connected as are gates 13 and 15 in FIG. 2 thereby forming what is known as a "collector tie" or "wired AND." A "wired AND" gate functions according to the principle that if any one of the outputs connected together has a "0" present then it will pull all of the other outputs down to a "0" level regardless of what signal would be present otherwise.

It will be convenient to refer to "wired AND" gates as having inputs and outputs, which are respectively the gates with outputs connected to the "wired AND" node and the gates with inputs connected to the node, even though in fact there are not separate inputs and outputs with different signals present, but rather all are connected together having the same signal present, that signal being determined by the interaction of the output terminals connected to the node.

It may be seen by looking at FIG. 2 that if either one of inverter gates 13 and 15 has a "0" signal present on the output then a "0" signal will be present on output terminal 16. Only if both inverter gates 13 and 15 have "1" signals present thereon will output terminal 14 have a "1" signal present thereon and so the logic AND function is performed at the common node of the outputs of inverter gates 13 and 15.

The "wired AND" gates formed by the connection of the outputs of gates 14 and 17 and gates 18 and 19 function the same as the "wired AND" gate formed by the connection of the outputs of gates 13 and 15.

With the matcher circuit of this invention connected as described the operation of the circuit may now be considered. Inputs 11 and 22 each have connected thereto a source of a binary signal and each source may present one of the two binary signals "0" and "1". Since there are two inputs and each input may have one of two signals present thereon there are a total of four possible input conditions each of which will be considered in the following.

Consider the input signal state characterized by a "1" signal present on each of input terminals 11 and 22. The outputs of each of inverter gates 13, 14, 17, and 18 has a "0" signal present thereon. Since gates 14 and 17 each have a "0" signal present at the output thereof, the "wired AND" gate formed by connecting their outputs via wire 20 will present a "0" signal to the inputs of inverter gates 15 and 19. The outputs of inverter gates 15 and 19, therefore, have a "1" signal present. "Wired AND" gates formed by connecting the outputs of gates 13 and 15, and gates 18 and 19 each have one input having a "1" signal present and one input having a "0" signal present and, therefore, both the "wired AND" gates and the output terminals 16 and 21 have "0" signals present which is indicative of the fact that the signals present on input terminals 11 and 22 match.

Next, consider the state of the circuit shown in FIG. 1 characterized by "0" signals being present on both inputs 11 and 22. Each of inverter gates 13, 14, 17, and 18 has a "0" signal present on the input and a "1" signal present on the output thereof. The "wired AND" gate formed by connecting the outputs of gates 14 and 17 has two inputs each having a "1" present thereon and therefore two outputs each having a "1" signal present thereon. The inputs to inverter gates 15 and 19 are each connected to the last mentioned "wired AND" gate and, therefore, each has a "1" signal present thereon and a "0" signal present on the output. Each of the "wired AND" gates formed by connecting the outputs of gates 13 and 15, and 18 and 19 has a "0" signal present on one input, a "1" signal present on the other input and, therefore, a "0" signal present on the output as well as on output terminals 16 and 21. The "0" signals present on output terminals 16 and 21 are indicative of the fact that the signals present on input terminals 11 and 22 are the same.

Next, consider the state of the circuit shown in FIG. 1 characterized by a "1" signal being present on input terminal 11 and A "0" signal being present on input terminal 22. Each of inverter gates 13 and 14 has a "1" signal present on the input and a "0" signal present on the output. Each of inverter gates 17 and 18 has a "0" signal present on the input and "1" signal present on the output. The "wired AND" gate formed by connecting the outputs of gates 14 and 17 has a "0" signal present on the input from inverter gate 14, a "1" signal present on the input from inverter gate 17 and, therefore, a "0" signal present on each of the two outputs thereof. Inverter gates 15 and 19 each being connected to the output of the last mentioned "wired AND" gate has a "0" signal present on the input and a "1" signal present on the output terminals thereof. The "wired AND" gate formed by connecting the outputs of gates 13 and 15 has a "1" signal present on the input connected to inverter gate 15 and a "0" signal present on the input connected to inverter gate 13 and, therefore, a "0" signal present on output terminal 16 which is connected thereto. The "wired AND" gate formed by connecting the outputs of gates 18 and 19 has a "1" signal present on the input connected to inverter gate 19, a "1" signal present on the input connected to inverter gate 18 and, therefore, a "1" signal present on the output connected to output terminal 21. The output condition of the circuit in this state comprising a "0" signal present on output terminal 16 and a "1" signal present on output terminal 21 is indicative of the fact that the two signals present on input terminals 11 and 22 are not equal and also that the particular unequal combination of input signals comprises a "1" signal present on input terminal 11 and a "0" signal present on input terminal 22.

Next, consider the state of the circuit shown in FIG. 1 when a "0" signal is present on input terminal 11 and a "1" signal is present on input terminal 22. Since the circuit shown in FIG. 1 is symmetrical about the horizontal axis cutting wire 20, the state of each point in the circuit under the present input condition is the same as the state of the corresponding point in the opposite half of the circuit under the input conditions described immediately above, namely a "1" signal present on input terminal 11 and a "0" signal present on input terminal 22. Output terminals 16 and 21, therefore, have a "1" and "0" signal present respectively which is indicative of the fact that the signals present on input terminals 11 and 22 are not equal and that the particular unequal input signal combination is a "0" signal on input terminal 11 and a "1" signal on input terminal 22.

What has been described is considered to be only a single illustrative embodiment of the invention and it is to be understood that various other arrangements may be devised by one skilled in the art without departing from the spirit and scope thereof as defined by the accompanying claims.

What is claimed is:

1. A matcher circuit for comparing first and second input signals to determine the equality or inequality of said signals comprising:
    identical first and second half matcher circuits each comprising: an input terminal, an output terminal, a cross-coupling terminal and means for generating an inequality signal at said output terminal in response to predetermined signals occurring simultaneously at said input terminal and said cross-coupling terminal; and
    a signal conduction means comprising a single wire interconnecting said cross-coupling terminals of said identical half matcher circuits.

2. A matcher circuit for comparing first and second input signals for determining the equality or inequality of said signals comprising:
    a first half matcher circuit comprising an input terminal for connection to a first signal source, a cross-coupling terminal, an output terminal and means comprising a plurality of inverter circuits for generating a first inequality signal at said output terminal of said first half matcher circuit in response to predetermined signals occurring simultaneously at said input terminal and said cross-coupling terminal;
    a second half matcher circuit identical in structure to said first half matcher circuit comprising an input terminal for connection to a second signal source, a cross-coupling terminal, an output terminal and means comprising a plurality of inverter circuits for generating a second inequality signal at said output terminal of said second half matcher circuit in response to predetermined signals occurring simultaneously at said input terminal and said cross-coupling terminal; and
    a single wire interconnecting said cross-coupling terminals of said identical first and second half matcher circuits.

3. A matcher circuit for determining the equality or inequality of a first signal and a second signal comprising:
    first and second inverter circuits each having an input to which the first signal is applied;
    third and fourth inverter circuits each having an input to which the second signal is applied;
    fifth and sixth inverter circuits each having an input connected to both the output of said second inverter circuit and the output of said third inverter circuit;
    a first output terminal having connected thereto the output of said first inverter circuit and said fifth inverter circuit; and
    a second output terminal having connected thereto the output of said fourth inverter circuit and the output of said sixth inverter circuit;
    whereby a first mismatch condition of said first and second signals will generate a mismatch signal on said first output terminal and a second mismatch condition of said first and second signals will generate a mismatch signal on said second output terminal.

4. A matcher circuit for determining the equality or inequality of a first signal and a second signal comprising:
    a first half matcher circuit comprising:
        a first and second inverter circuit each having an input to which the first signal is applied;
        a third inverter circuit having an input connected to the output of said second inverter circuit; and
        a first output terminal having connected thereto the output of said first inverter circuit and the output of said third inverter circuit;
    a second half matcher circuit comprising:
        a fourth and a fifth inverter circuit each having an input to which the second signal is applied;
        a sixth inverter circuit having an input connected to the output of said fifth inverter circuit; and
        a second output terminal having connected thereto the output of said fourth inverter circuit and the output of said sixth inverter circuit; and
        a single wire connecting the output of said second inverter circuit and the output of said fifth inverter circuit.

* * * * *